US012761282B2

(12) United States Patent
Ruiz Alvarez et al.

(10) Patent No.: US 12,761,282 B2
(45) Date of Patent: Oct. 13, 2026

(54) BATTERY HEALTH AWARE THERMAL MANAGEMENT SYSTEM

(71) Applicant: Garrett Transportation I Inc., Torrance, CA (US)

(72) Inventors: Semaria Ruiz Alvarez, Prague (CZ); Tomas Poloni, Malinovo (SK); Matej Pcolka, Prague (CZ)

(73) Assignee: Garrett Transportation I Inc., Torrance, CA (US)

( * ) Notice: Subject to any disclaimer, the term of this patent is extended or adjusted under 35 U.S.C. 154(b) by 151 days.

(21) Appl. No.: 18/501,686

(22) Filed: Nov. 3, 2023

(65) Prior Publication Data

US 2025/0042302 A1 Feb. 6, 2025

Related U.S. Application Data

(60) Provisional application No. 63/517,577, filed on Aug. 3, 2023.

(51) Int. Cl.

| | |
|---|---|
| ***G01R 31/374*** | (2019.01) |
| ***B60L 53/62*** | (2019.01) |
| ***B60L 58/12*** | (2019.01) |
| ***B60L 58/16*** | (2019.01) |
| ***G01R 31/387*** | (2019.01) |

(52) U.S. Cl.

CPC ............ *G01R 31/374* (2019.01); *B60L 53/62* (2019.02); *B60L 58/12* (2019.02); *B60L 58/16* (2019.02); *G01R 31/387* (2019.01)

(58) Field of Classification Search

CPC ........ B60L 3/0046; B60L 50/60; B60L 53/62; B60L 58/12; B60L 58/16; B60L 58/26; B60L 2240/545; G01R 31/367; G01R 31/396; H01M 10/486; H01M 10/613; H01M 10/633; H01M 10/6569; H01M 10/44; H02J 7/0048; H02J 2310/48; H02J 7/04; Y02T 10/70; Y02T 10/7072; G05B 13/04; G05B 13/048

See application file for complete search history.

(56) References Cited

U.S. PATENT DOCUMENTS

| | | | |
|---|---|---|---|
| 6,075,346 | A | 6/2000 | Kikuchi et al. |
| 6,674,265 | B2 | 1/2004 | Yoshida et al. |
| 7,647,788 | B2 | 1/2010 | Okuda et al. |
| 8,082,743 | B2 | 12/2011 | Hermann et al. |

(Continued)

FOREIGN PATENT DOCUMENTS

| | | |
|---|---|---|
| EP | 3499634 A1 | 6/2019 |
| EP | 3878706 A1 | 9/2021 |

(Continued)

*Primary Examiner* — Scott A Browne
*Assistant Examiner* — Jisun Choi
(74) *Attorney, Agent, or Firm* — BelayIP

(57) ABSTRACT

Control architectures and methods for use in a vehicle having a battery and a powertrain including an electric motor that receives power from the battery. A battery thermal management system is controlled to minimize economic costs that are summed from each of costs of battery deterioration and costs of maintaining the battery at given temperatures. The control architecture is for the thermal management system and treats battery current as a disturbance rather than as a controlled parameter.

20 Claims, 7 Drawing Sheets

(56) References Cited

U.S. PATENT DOCUMENTS

| | | | |
|---|---|---|---|
| 8,344,697 B2 | 1/2013 | Lienkamp et al. | |
| 8,410,760 B2 | 4/2013 | Formanski et al. | |
| 9,328,945 B2 | 5/2016 | Arai et al. | |
| 9,643,469 B2 | 5/2017 | Kakehashi et al. | |
| 9,893,394 B2 | 2/2018 | Shin et al. | |
| 10,000,138 B2 | 6/2018 | Tanaka | |
| 10,388,998 B2 | 8/2019 | Choi et al. | |
| 11,084,398 B2 | 8/2021 | Marcicki et al. | |
| 11,605,849 B2 | 3/2023 | Chuang | |
| 2009/0167253 A1 | 7/2009 | Muraoka et al. | |
| 2009/0326749 A1 | 12/2009 | Uchida | |
| 2012/0116699 A1 | 5/2012 | Haag et al. | |
| 2013/0066498 A1 | 3/2013 | Nissato | |
| 2013/0113424 A1 | 5/2013 | Froelich | |
| 2013/0147432 A1 | 6/2013 | Yamamoto et al. | |
| 2014/0014421 A1 | 1/2014 | Carpenter et al. | |
| 2014/0023905 A1 | 1/2014 | Taniyama et al. | |
| 2014/0195179 A1* | 7/2014 | Guerin | H01M 10/486 702/63 |
| 2014/0210415 A1 | 7/2014 | Ohmori | |
| 2014/0306519 A1 | 10/2014 | Song | |
| 2014/0326430 A1 | 11/2014 | Carpenter et al. | |
| 2014/0338376 A1 | 11/2014 | Carpenter et al. | |
| 2015/0079433 A1 | 3/2015 | Tamai et al. | |
| 2015/0165919 A1 | 6/2015 | Hughes | |
| 2015/0316903 A1* | 11/2015 | Asmus | G05B 19/418 |
| 2016/0229411 A1 | 8/2016 | Murata | |
| 2016/0301114 A1 | 10/2016 | Izumi et al. | |
| 2016/0318499 A1 | 11/2016 | Yamanaka et al. | |
| 2016/0332505 A1 | 11/2016 | Yamanaka et al. | |
| 2016/0351981 A1 | 12/2016 | Porras et al. | |
| 2016/0377306 A1* | 12/2016 | Drees | H02J 3/28 700/295 |
| 2017/0088008 A1 | 3/2017 | Melendez et al. | |
| 2017/0120774 A1 | 5/2017 | Obata | |
| 2017/0120775 A1 | 5/2017 | Murata et al. | |
| 2017/0133731 A1 | 5/2017 | Hermann | |
| 2017/0305292 A1 | 10/2017 | Minamiura et al. | |
| 2017/0306871 A1* | 10/2017 | Fuxman | F02D 41/1401 |
| 2017/0352930 A1 | 12/2017 | Masias et al. | |
| 2018/0226695 A1 | 8/2018 | Miyaki et al. | |
| 2018/0287227 A1 | 10/2018 | Jeong et al. | |
| 2019/0140327 A1 | 5/2019 | Fukada et al. | |
| 2020/0205318 A1* | 6/2020 | Hulse | G06F 1/20 |
| 2020/0212515 A1 | 7/2020 | King et al. | |
| 2021/0031654 A1 | 2/2021 | Vizzini et al. | |
| 2021/0101504 A1 | 4/2021 | Okamoto et al. | |
| 2021/0242518 A1 | 8/2021 | Shrivastava et al. | |
| 2021/0273270 A1 | 9/2021 | Fujikawa et al. | |
| 2021/0300197 A1 | 9/2021 | Yi | |
| 2021/0379999 A1 | 12/2021 | Yang et al. | |
| 2021/0382115 A1 | 12/2021 | Woll et al. | |
| 2021/0384753 A1 | 12/2021 | Kozuma et al. | |
| 2022/0009367 A1 | 1/2022 | Lee et al. | |
| 2022/0131400 A1 | 4/2022 | Nakao et al. | |
| 2022/0149645 A1 | 5/2022 | Ramanujam et al. | |
| 2022/0381835 A1 | 12/2022 | Yang et al. | |
| 2023/0099486 A1* | 3/2023 | Wiese | H01M 10/625 429/62 |
| 2024/0001799 A1* | 1/2024 | Jin | B60L 58/16 |
| 2024/0391341 A1* | 11/2024 | Zhu | H01M 10/443 |

FOREIGN PATENT DOCUMENTS

| | | | |
|---|---|---|---|
| WO | 2005039919 | A1 | 6/2005 |
| WO | 2009020217 | A1 | 2/2009 |
| WO | 2011001609 | A1 | 1/2011 |
| WO | 2013157214 | A1 | 1/2013 |
| WO | 2012091076 | A1 | 6/2014 |
| WO | 2015045505 | A1 | 4/2015 |
| WO | 2018079164 | A1 | 5/2018 |
| WO | 2019138731 | A1 | 7/2019 |
| WO | 2019163398 | A1 | 8/2019 |
| WO | 2019181311 | A1 | 9/2019 |
| WO | 2019243157 | A1 | 12/2019 |
| WO | 2020051738 | A1 | 3/2020 |
| WO | 2020131948 | A1 | 6/2020 |
| WO | 2021185308 | A1 | 9/2021 |
| WO | 2021229070 | A1 | 11/2021 |
| WO | 2021229072 | A1 | 11/2021 |
| WO | 2022024848 | A1 | 2/2022 |
| WO | 20222024885 | A1 | 2/2022 |
| WO | 2022056486 | A1 | 3/2022 |
| WO | 2022119524 | A1 | 6/2022 |
| WO | 20221328745 | A1 | 6/2022 |
| WO | 2022143129 | A1 | 7/2022 |
| WO | 2022268362 | A1 | 12/2022 |
| WO | 2022269538 | A1 | 12/2022 |

* cited by examiner

BATTERY HEALTH AWARE THERMAL MANAGEMENT SYSTEM

CROSS REFERENCE TO RELATED APPLICATIONS

The present application claims the benefit of and priority to U.S. Provisional Patent Application No. 63/517,577, titled CONTROL SYSTEMS, METHODS AND DEVICES, filed on Aug. 3, 2023, the disclosure of which is incorporated herein by reference.

BACKGROUND

Hybrid and electric-only vehicles (collectively, EVs) use rechargeable battery packs to provide driving power. The life span of batteries, as well as their working performance, can be affected by temperature of operation. EVs typically include a battery thermal management system (BTMS) to control the temperature of the battery pack. By doing so, a BTMS also controls the efficiency and state of health of the battery pack during each of normal driving operation and charging. Moreover, the widespread adoption of "fast" charging profiles includes the use of high current and high temperature battery operations, making BTMS actions critical to battery performance, health, and longevity.

BTMS systems may be integrated with other thermal management demands of the vehicle. These may include passenger cabin, system inverter, engine (for a hybrid vehicle), and DC motor cooling systems. Various literature suggests ways of handling integration of multiple subsystem demands, however, consensus is lacking as to best control practices to implement for a BTMS in an EV. This is partly due to diverse views on recommended battery temperature operational ranges and lack of consideration of the need to modify the battery temperature range in response to different states of charge (SOC), as well as the need to accommodate fast charging profiles. Hence, new and alternative methods and control systems are desired.

Overview

The present inventors have recognized, among other things, that a problem to be solved is the need for alternative predictive control strategies for the elements of the battery thermal management system. Such strategies may include considering the battery current as a disturbance or uncontrollable input for the system, and the temperatures at different points of a battery thermal management system as controlled variables, which are manipulated through the activation of the cooling, pumping, and/or heating elements in the system. This proposal integrates the models of the different parts of the system to suggest an integral control strategy that has as overall objectives the minimization of the energy consumption of the elements (maximizing the range of the vehicle) and the maximization of the battery health through the control of the temperature profiles in the battery.

A first illustrative and non-limiting example takes the form of a vehicle comprising: a powertrain including an electric motor and a rechargeable battery coupled to the electric motor to provide drive power for the vehicle, the rechargeable battery including a first temperature sensor configured to sense a temperature of the rechargeable battery; a thermal management system for the rechargeable battery using a circulating fluid to control temperature of the rechargeable battery, the thermal management system including a chiller for cooling the circulating fluid; and a BTMS controller configured to control operation the thermal management system by: obtaining a set of temperatures from the thermal management system, including at least one temperature of the circulating fluid, and a battery temperature; estimating a state of charge (SOC) of the battery; using a battery thermal model to estimate heat transfer between the circulating fluid and the battery, and a chiller model to estimate heat transfer in the chiller; predicting, in a time horizon, a battery current; applying a cost function minimization to determine control parameters to issue to the thermal management system by minimizing a sum of economic costs of battery health effects in the time horizon, the sum of economic costs varying with SOC of the battery, and economic costs of operation of the thermal management system in the time horizon; and issuing the control parameters to the thermal management system. Additionally or alternatively, the thermal management system may also include a heater for increasing the temperature of the battery, for example, in cold weather conditions, and the BTMS controller also controls the use of the heater.

Additionally or alternatively, the BTMS controller is configured to perform the cost function minimization by selecting from at least two models of battery deterioration based on the predicted battery current in the time horizon. Additionally or alternatively, the BTMS controller is configured to perform the cost function minimization by using a model for battery deterioration due to aging, applicable to portions the time horizon in which the battery current is predicted to be below a nominal threshold. Additionally or alternatively, the BTMS controller is configured to perform the cost function minimization by using a model for battery deterioration during battery discharge due to powertrain operation, applicable to portions of the time horizon in which the battery current is predicted to be issued from the battery to the powertrain. Additionally or alternatively, the BTMS controller is configured to perform the cost function minimization by using a model for battery deterioration during battery charging, applicable to portions of the time horizon in which the battery current is predicted to be injected to the battery at a level that exceeds a nominal threshold.

Additionally or alternatively, the BTMS controller is configured to perform the cost function minimization using a non-linear model predictive control (NMPC) analysis. Additionally or alternatively, the BTMS controller is configured to use the NMPC analysis to calculate a plurality of sets of control signals through the prediction horizon, issue a first of the sets of control signals, obtain a new set of temperatures, and repeat the cost function minimization.

Additionally or alternatively, the thermal management system includes a chiller coupled to a vapor cycle cooling system, and a pump, wherein the set of control signals includes at least a control signal for operation of the pump, and a setpoint for the vapor cycle cooling system.

Additionally or alternatively, the thermal management system includes a heater and first and second valves for directing flow of the circulating fluid through either the heater or the chiller, and the economic costs in the cost function minimization include a term for the heater and a term for the chiller.

Additionally or alternatively, further examples may include methods of operation by the BTMS controller described in the preceding examples. Additional examples may take the form of a BTMS controller as described in the preceding examples, separate from a vehicle or adapted for placement and use in a vehicle.

Another illustrative and non-limiting example takes the form of a vehicle comprising: a powertrain including an electric motor and a rechargeable battery coupled to the electric motor to provide drive power for the vehicle, the rechargeable battery including a first temperature sensor configured to sense a temperature of the rechargeable battery; a thermal management system for the rechargeable battery using a circulating fluid to control temperature of the rechargeable battery, the thermal management system including a chiller for cooling the circulating fluid; and a reference tracking controller coupled to the thermal management system and configured to use a set of references to control operation of the thermal management system; a non-linear optimizing controller configured to calculate and communicate the set of references to the reference tracking controller by: obtaining a set of temperatures from the thermal management system, including at least one temperature of the circulating fluid, and a battery temperature; estimating a state of charge (SOC) of the battery; using a battery thermal model to estimate heat transfer between the circulating fluid and the battery, and a chiller model to estimate heat transfer in the chiller; predicting, in a time horizon, a battery current; applying a cost function minimization to determine the set of references for controlling the thermal management system by minimizing a sum of economic costs of battery health effects in the time horizon, the sum of economic costs varying with SOC of the battery, and economic costs of operation of the thermal management system in the time horizon; and issuing the set of references to the reference tracking controller.

Additionally or alternatively, the non-linear optimizing controller is configured to periodically calculate and communicate the set of references to the reference tracking controller at a first period, and the reference tracking controller is configured to apply the set of references to control the thermal management system using a second period, the second period being shorter than the first period.

Additionally or alternatively, the non-linear optimizing controller is configured to perform the cost function minimization by selecting from at least two models of battery deterioration based on the predicted battery current in the time horizon. Additionally or alternatively, the non-linear optimizing controller is configured to perform the cost function minimization by using a model for battery deterioration due to aging, applicable to portions the time horizon in which the battery current is predicted to be below a nominal threshold. Additionally or alternatively, the non-linear optimizing controller is configured to perform the cost function minimization by using a model for battery deterioration during battery discharge due to powertrain operation, applicable to portions of the time horizon in which the battery current is predicted to be issued from the battery to the powertrain. Additionally or alternatively, the non-linear optimizing controller is configured to perform the cost function minimization by using a model for battery deterioration during battery charging, applicable to portions of the time horizon in which the battery current is predicted to be injected to the battery at a level that exceeds a nominal threshold.

Additionally or alternatively, the non-linear optimizing controller is configured to perform the cost function minimization using a non-linear model predictive control analysis.

Additionally or alternatively, the thermal management system includes a chiller coupled to a vapor cycle cooling system, and a pump, wherein the set of references includes at least a reference for operation of the pump, and a reference for the vapor cycle cooling system.

Additionally or alternatively, the thermal management system includes a heater and first and second valves for directing flow of the circulating fluid through either the heater or the chiller, and the economic costs in the cost function minimization include a term for the heater and a term for the chiller.

Additionally or alternatively, further examples may include methods of operation by the non-linear optimizing controller and/or reference controller, operating separately or together, as described in the preceding examples. Additional examples may take the form of a non-linear optimizing controller and/or reference controller as described in the preceding examples, separate from a vehicle or adapted for placement and use in a vehicle, each separately or together in various examples.

Another illustrative and non-limiting example takes the form of a method of controlling battery temperature in a vehicle, the vehicle including a powertrain including an electric motor and a battery coupled to the electric motor to provide drive power for the vehicle, the rechargeable battery including a first temperature sensor configured to sense a temperature of the battery, and a thermal management system for the battery using a circulating fluid to control temperature of the battery, the thermal management system including a chiller for cooling the circulating fluid; the method comprising: issuing control signals from a reference tracking controller to control operation of the thermal management system using a set of references; issuing the set of references to the reference tracking controller from a non-linear optimizing controller; calculating the set of references at the reference tracking controller by: obtaining a set of temperatures from the thermal management system, including at least one temperature of the circulating fluid, and a battery temperature; estimating a state of charge (SOC) of the battery; using a battery thermal model to estimate heat transfer between the circulating fluid and the battery, and a chiller model to estimate heat transfer in the chiller; predicting, in a time horizon, a battery current; and applying a cost function minimization to determine the set of references for controlling the thermal management system by minimizing a sum of economic costs of battery health effects in the time horizon, the sum of economic costs varying with SOC of the battery, and economic costs of operation of the thermal management system in the time horizon.

Additionally or alternatively, the step of calculating the set of references is performed by using a model for battery deterioration due to aging, applicable to portions the time horizon in which the battery current is predicted to be below a nominal threshold. Additionally or alternatively, the step of calculating the set of references is performed by using a model for battery deterioration during battery discharge due to powertrain operation, applicable to portions of the time horizon in which the battery current is predicted to be issued from the battery to the powertrain. Additionally or alternatively, the step of calculating the set of references is performed by using a model for battery deterioration during battery charging, applicable to portions of the time horizon in which the battery current is predicted to be injected to the battery at a level that exceeds a nominal threshold.

Additionally or alternatively, the step of performing the cost function minimization uses a non-linear model predictive control analysis. Additionally or alternatively, the thermal management system includes a chiller coupled to a vapor cycle cooling system, and a pump, wherein the set of references includes at least a reference for operation of the pump, and a reference for the vapor cycle cooling system. Additionally or alternatively, the thermal management system includes a heater and first and second valves for directing flow of the circulating fluid through either the heater or the chiller, and the economic costs in the cost function minimization include a term for the heater and a term for the chiller.

This overview is intended to provide an introduction to the subject matter of the present patent application. It is not intended to provide an exclusive or exhaustive explanation. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
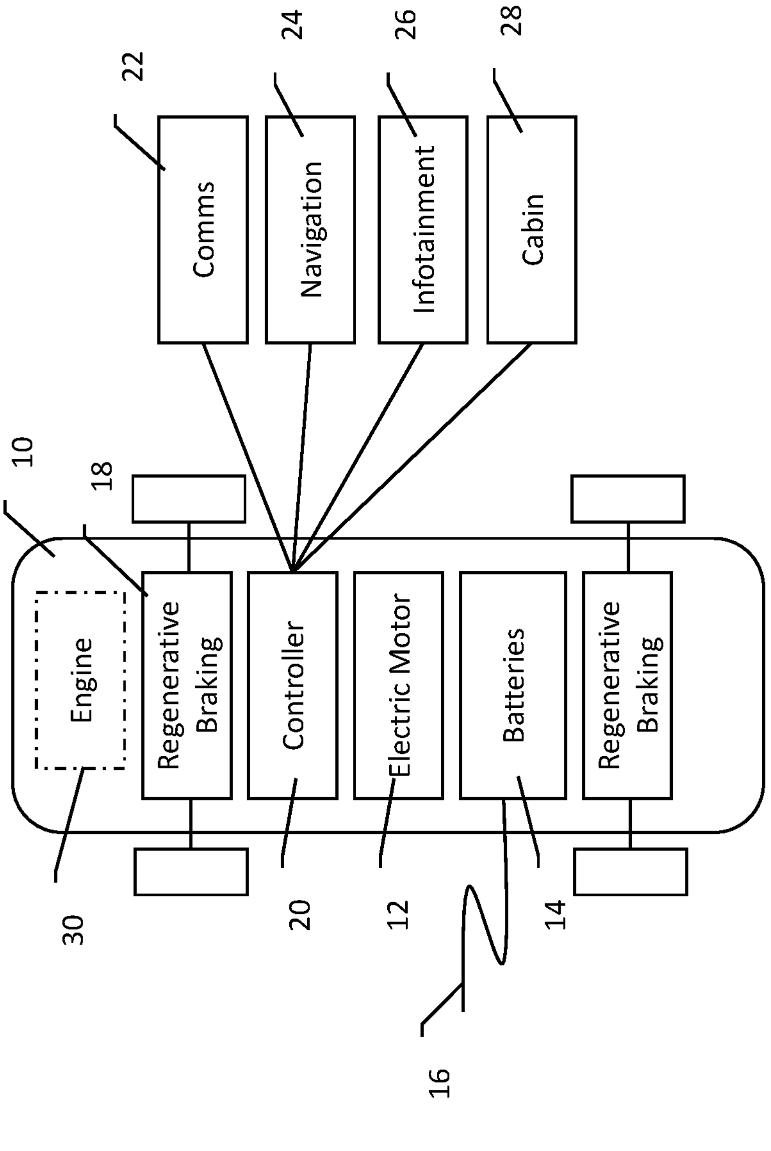
FIG. 1 shows an illustrative vehicle in simplified block form.

FIG. 1 shows an electric vehicle in simplified block form. It must be considered that the following discussion may not necessarily describe every feature that would be present in the vehicle 10, to avoid excessive exposition of features that are not needed to understand the following examples.

The vehicle 10 is characterized by an electric motor 12 (or plural electric motors 12) that provide driving force to the vehicle 10, powered by batteries 14. The batteries 14 are rechargeable by connection 16 to an off-vehicle electricity source, as is known in the art, and may have any suitable chemistry and/or design. Batteries 14 may be connected to warming and/or cooling apparatuses to maintain suitable temperatures therein, as further explained below. Regenerative braking 18 may be provided, and serves to at least partly recharge the batteries 14 under suitable braking conditions. For hybrid vehicles, an engine 30 may be included, such as an internal combustion engine, though several examples herein are usable in electric-only vehicles. As used herein, "EV" indicates any of a hybrid vehicle having two power systems including at least one that uses a motor and batteries, or an electric-only vehicle lacking a second power system.

A controller 20 is coupled to each of these blocks, and may further be linked to control blocks for communications 22, navigation 24, infotainment 26, and cabin 28. The controller 20 is configured for sending and receiving information as well as to provide and/or control power used by, for example, an air conditioning unit used for cooling the cabin 28, or other environmental controls for the cabin 28. The communications 22 may include any of satellite, cellular, Bluetooth, broadband, WiFi, and/or various other wireless communications circuits, antennae, receivers, transceivers, transmitters, etc., as desired. The communications 22 may allow the controller 20 to send and receive data relative to one or more internet, dedicated, and/or cloud-based data receiving and/or processing centers, such as a fleet monitor. The communications 22 may be used to upload and/or download data of various types. The navigation system 24 may store, retrieve, receive, and/or display various types of data including, for example and without limitation, weather/environmental data, road data including curvature, posted speed limits, and grade, as well as traffic data, as desired. The navigation system 24 may also be used to provide route instructions to a driver of the vehicle, and/or to provide a route for an autonomous drive controller to use. The navigation system 24 may include a global positioning system (GPS) device for determining and tracking position of the vehicle 10.

Figure 2:
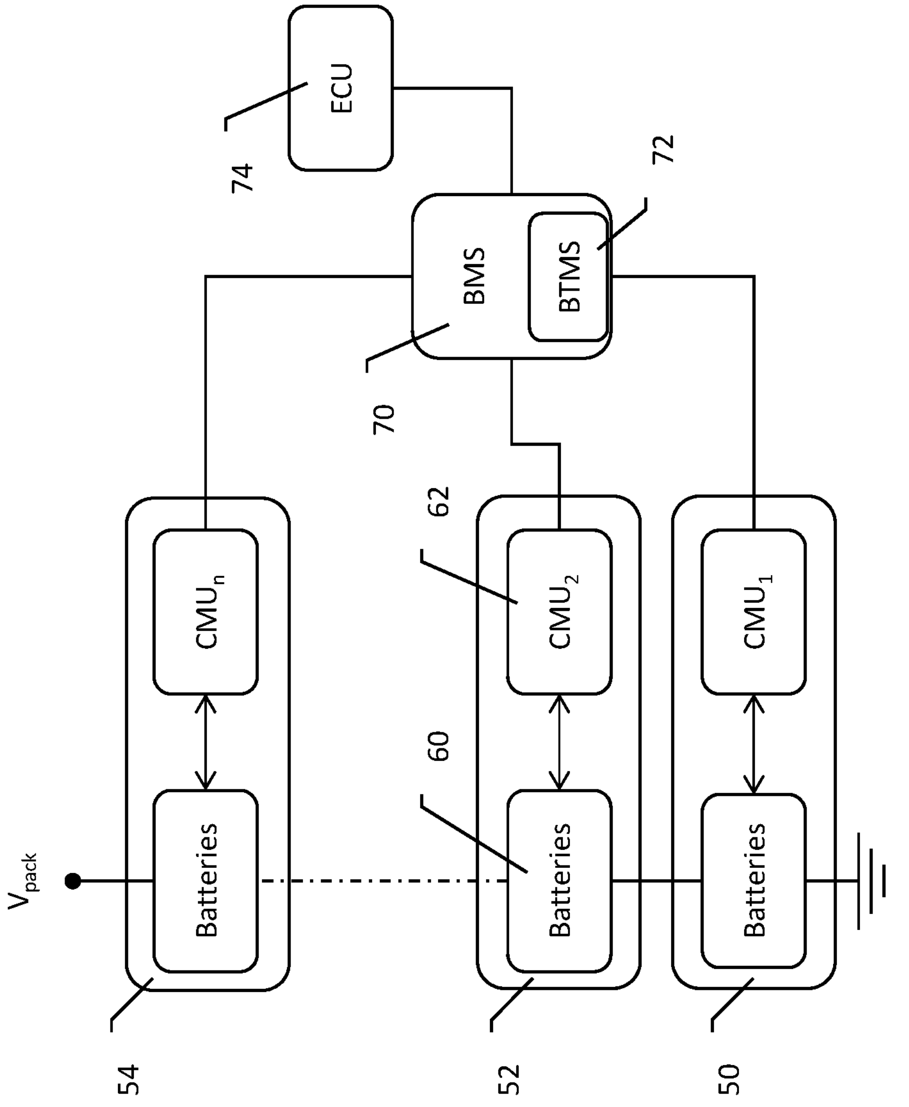
FIGS. 2-3 show illustrative battery pack configurations.
Figure 3:
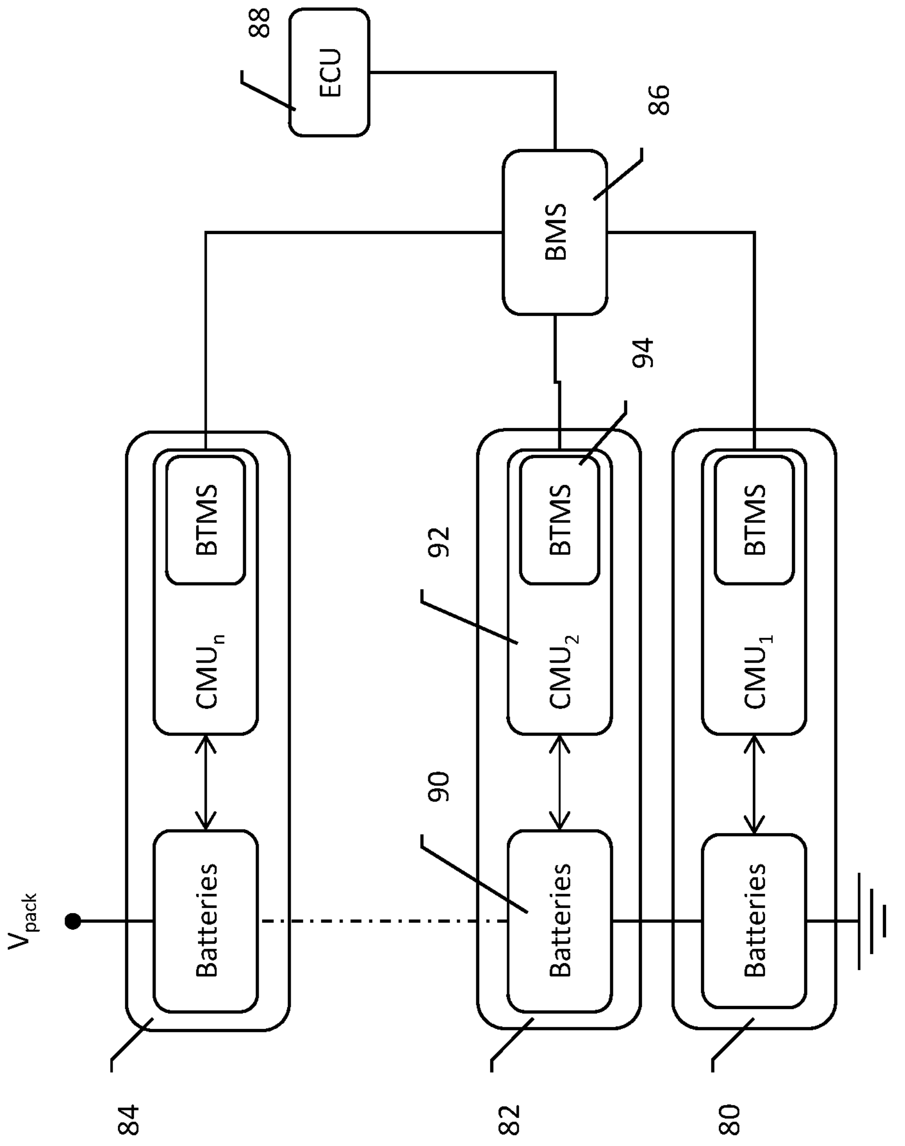

FIGS. 2-3 show illustrative battery pack configurations. An EV battery pack includes a plurality of modules 50, 52, 54, each having a set of cells 60 and a cell management unit (CMU). The cells 60 in each module 50, 52, 54 may be a collection of cells in series and/or in parallel. The CMU 62 has circuitry and sensors for cell voltage measurement, temperature measurements and cell balancing, and is configured to monitor the cells and keep the module 52 in a safe operating region. Cell voltage may be sampled several times a second, for example, ten to one hundred times a second. Surface temperature may be sampled less frequently, for example, one to ten times a second, as it moves more slowly, and a typical installation may have one temperature sensor for every two cells, though more or fewer sensors may be used in a particular system. Current flow may be monitored at the pack level in some systems.

Data gathered by the CMU 62 is communicated, such a via wire, wireless or bus, to a battery management unit or battery management system (BMS) 70. The BMS performs various estimations of battery and pack status, and sends commands to each CMU for actions such as cell balancing, cell voltage measurement, and temperature sensing and reporting. For example, state of charge (SOC) may be estimated using the battery voltage measurements and/or current monitoring. State of health (SOH) may be estimated using one or more of the internal resistances of the battery/battery cells, as well as data related to the amount of charge that can be held in the batteries, which will drop over time, and is determined using known methods such as tracking current flows into and out of the battery while also monitoring SOC based on cell voltage measurements.

State of power (SOP) may be estimated and represents the instantaneous power output capability of the battery, which will relate to the SOC and the internal resistance, among other factors. In this example, the BMS 70 includes a battery thermal management system (BTMS) 72, such as in the form of a separate control module (microcontroller or microprocessor, for example) or as a collection of controller-executable or readable instructions stored in memory. The BMS may be in communication with an electronic control unit (ECU) 74 for the vehicle overall or for the combined battery and motor system, for example. The BTMS 72 may instead reside at the ECU level, if desired.

FIG. 3 shows an alternative configuration. Here the modules 80, 82, 84 each again include batteries 90 and a CMU 92, where the BTMS 94 is provided as part of each CMU 92. The modules 80, 82, 84 are managed by the BMS 86 which, as before, may also communicate with a system ECU 88.

In some examples, the present methods and control systems provide activation of a preconditioning function for fast charging processes considering each of the state of health of the battery and the energy cost of actions by the BTMS. In some examples, a receding horizon, economic-based non-linear model predictive control system is applied. In some examples, a hierarchical non-linear optimization is performed, using a temperature reference tracking controller, so that references can be sent to the lower levels of control for implementation and use. For example, the optimization may occur in an advanced control framework as described in US PG Pub. 2022/0343702, the disclosure of which is incorporated herein by reference, or may be performed remotely such as in a cloud-based server. Optimization may instead occur at a system or vehicle level ECU, with references communicated to the BMS or CMUs. Optimization may be performed by the BMS as desired, with control parameters sent to the CMU from the BMS.

Each ECU, CMU, BMS and/or BTMS may be implemented as a controller, microcontroller, microprocessor, or other hardware operating in accordance with stored instructions in a readable memory. In addition, one or more signals incoming to such a controller may be processed using dedicated hardware, such as application-specific integrated circuits (ASIC), discrete componentry, various logic and timer circuitry, and the like. One or more ASICs or other subcircuits may be used to condition, filter, and convert incoming sensed signals to digital form for use in a controller, or the controller itself may include such circuitry, as desired.

Figure 4:
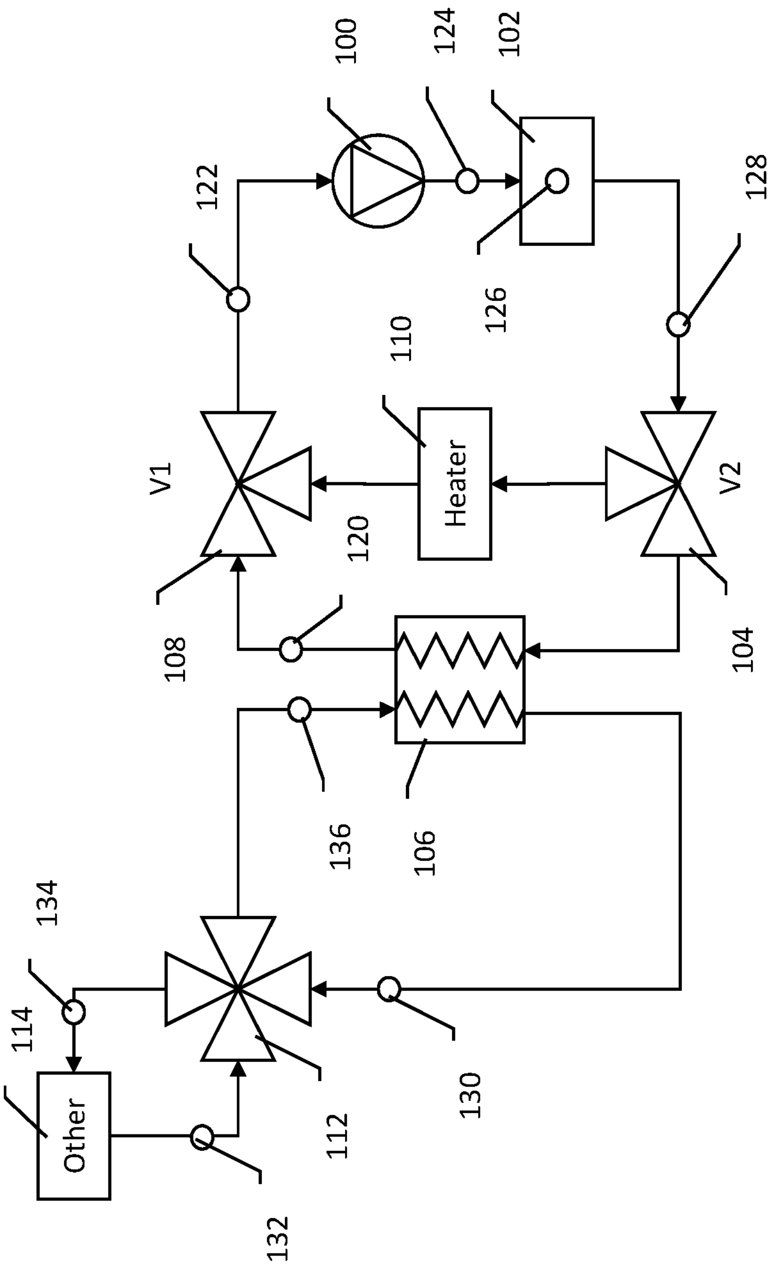
FIGS. 4-5 show illustrative thermal management systems.

One illustrative methodology uses a non-linear model predictive control (NMPC) strategy for a system that describes the behavior of the temperature in critical points of the thermal management circuit. FIG. 4 is illustrative as to the temperature monitoring points in an illustrative system. The system includes a coolant pump 100 that circulates coolant through the battery pack 102. A three-way valve 104 selectively allows coolant to pass to chiller 106 or heater 110, depending on thermal needs at a given time. Another three-way valve 108 determines the return flow to the coolant pump 100 from the chiller 106 and heater 110. The chiller 106 also provides coolant circulation to a multi-selector valve 112 that controls coolant flow to other system components 114, such as for use in cabin temperature control, the inverter, or the vehicle drive motor, as needed.

Sensors for monitoring one or more of pressure, temperature, and/or mass flow can be provided at various points. Characteristics of coolant exiting the chiller 106 may be monitored at location 120. Characteristics of coolant entering the coolant pump 100 can be monitored at location 122. Characteristics of coolant exiting the coolant pump 100 can be monitored at location 124. The battery pack 102 may include one or more temperature sensors indicated schematically at 126. Characteristics of coolant exiting the battery pack 102 can be monitored at location 128. Coolant exiting the chiller and directed toward other components 114 can be monitored at location 130, and returning coolant from the other components 114 can be monitored at location 132, returning from any other systems or components 114, and also at location 136, just before entering the chiller 106.

Figure 5:
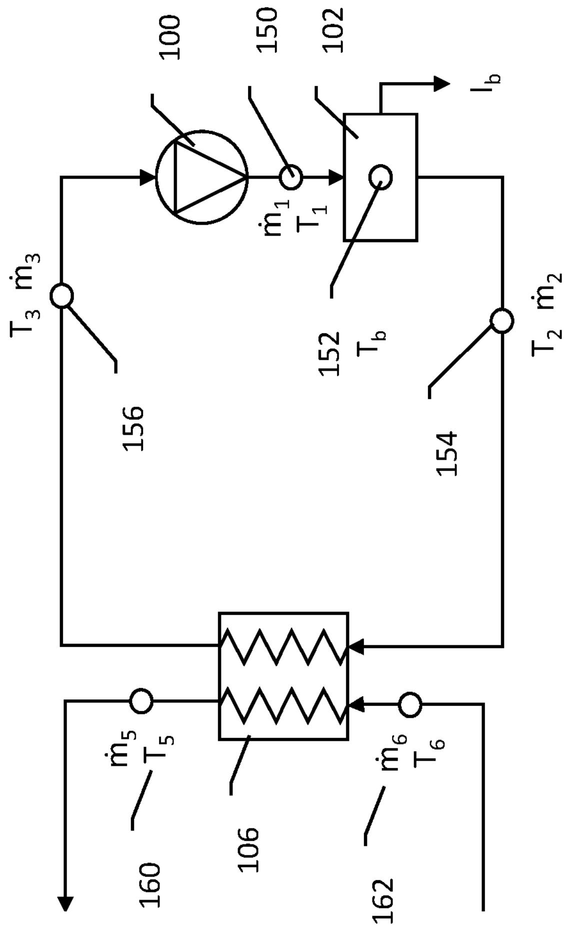

FIG. 5 shows another example, this time introducing some of the symbol conventions used herein. Other component coolant circulation is omitted to focus on just the battery pack cycle in FIG. 5. In this example, location 150, between pump 100 and battery pack 102, may be have sensors for mass flow exiting the pump 100, designated as $m_1$, and temperature of coolant exiting the pump 100, designated as $T_1$. Location 152 can be used to sense internal battery temperature, referenced as $T_b$. There may be multiple battery temperature sensors, as desired. Location 154 may be used to sense coolant temperature and mass flow exiting the battery pack 102, designated as $T_2$ and $m_2$, respectively. Location 156 may be used to sense coolant temperature and mass flow exiting the chiller 106, designated as $T_3$ and $m_3$, respectively.

The cooling system, which may take any suitable form, provides chilled liquid refrigerant to the chiller 106, and receives warmer liquid refrigerant therefrom. The temperature and mass flow of refrigerant exiting the chiller 106 may be measured, for example at location 160, and are designated as $T_5$ and $m_5$, respectively. The temperature and mass flow of liquid refrigerant entering the chiller can be measured as well, including temperature and mass flow, as noted at 162 these can be designated $T_6$ and $m_6$, respectively. In some examples, the chiller 106 may have an evaporator on the cooling system side, in which case liquid refrigerant may enter the chiller 106, evaporates to a gaseous state, and exits, for example if a vapor cycle cooling system is used.

An economic and health aware control for the BTMS may generally originate with the following minimization and constraints:

$$\min_u \sum_{\tau=t}^{t+N} l(x(\tau), u(\tau), w(\tau), W(\tau)) \tag{1}$$

Subject to:

$$x(\tau+\Delta t) = f(x(\tau), u(\tau), w(\tau)),\ \forall\ \tau \in \{t, t+\Delta t, \ldots, t+N-\Delta \text{t}, t+N\}$$

$$x(t) = z(t)$$

$$x_{min} \le x(\tau) \le x_{max},\ \forall\ \tau \in \{t, t+\Delta t, \ldots, t+N-\Delta t, t+N\}$$

$$u_{min} \le u(\tau) \le u_{max},\ \forall\ \tau \in \{t, t+\Delta t, \ldots, t+N-\Delta t, t+N\}$$

$$l(x(\tau), u(\tau), w(\tau), W(\tau)) = l_{EC}(x(\tau), u(\tau), w(\tau), W_{EC}(\tau)) + l_{HC}(x(\tau), u(\tau), w(\tau), W_{HC}(\tau))$$

The variable x represents the states of the dynamic system, which includes the temperature at several points identified above, the state of charge (SOC) of the battery, and additional variables of interest. The variable u corresponds to the controllable inputs of the system, that is, the control actions of the BTMS. Variable w represents the uncontrollable inputs, or disturbances, of the system. $W(\tau)$ represents the weights of individual cost function terms, and includes $W_{EC}(\tau)$ and $W_{HC}(\tau)$, where the subscript EC indicates economic cost, and subscript HC indicates battery health cost. $W(\tau)$ represents the main tuning parameters of the controller, which may change as a function of one or more of time, environmental conditions, or other variables as desired. Variable z indicates the measurements available to the controller, including the several temperatures and mass flows indicated above; additional pressure or other measurements may be used as desired.

If needed, a state estimator or observer may be used to estimate or calculate any of the variables based on the measured data and a model of system components. An example may be if one or more temperatures or mass flows are not directly measured but instead are estimated using available data from other sensors and one or more models of system operation. Estimations of temperature, mass flows and even pressures using models may be referred to as virtual sensors. Any suitable method or approach may be used, such as Kalman filters, which may be linear, extended, and/or unscented, and/or Leunberger observer, or a moving horizon estimator, for example and without limitation.

In Equation 1 and its constraints, N indicates the length of the prediction horizon, $\Delta t$ is the sampling time, $\tau$ represents the discrete time of the controller, and t is the absolute time.

Also in Equation 1, the function l(•) is the stage cost function, which is related to the energy consumption of the BTMS elements, denoted as $l_{EC}(\bullet)$, and the cost of health degradation of the battery, denoted as $l_{HC}(\bullet)$. Cost of health degradation of the battery may be a function of, for example, the cost of the capacity loss due to the degradation of the battery induced by the established temperature profile, and the current passed therethrough. Finally, $f$ stands for the state transition function.

Figure 6:
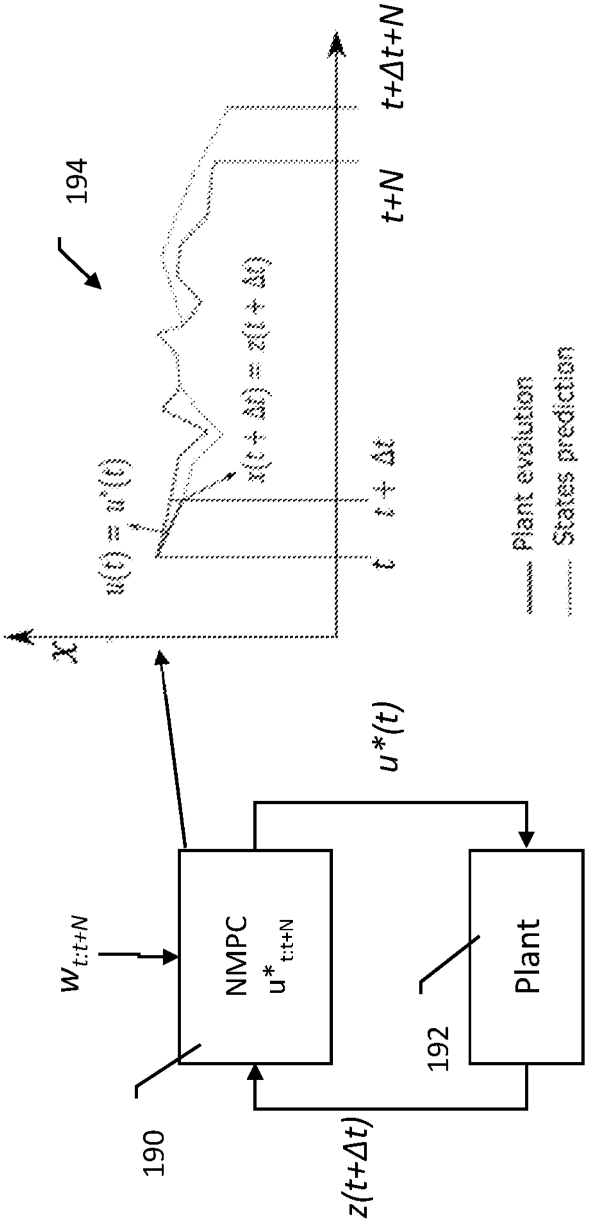
FIGS. 6-7 show illustrative controller configurations.

FIG. 6 shows an illustrative controller configuration. The non-linear model predictive control (NMPC) 190 calculates a set of optimal control actions, $u^*_{t:t+N}$, over the time horizon, using the forecast disturbances $w_{t:t+N}$ over the time horizon. NMPC 190 then issues the first of the set of control actions, u*(t) to the plant 192, which executes those actions. The measurements for the next time instance, z(t+Δt) as indicated at 192, are communicated back to the NMPC. With the new measurements, the NMPC restarts its calculations to yield a new optimized control action set. That is, the NMPC discards the rest of the time horizon and analytical outcomes after the first set of control actions are generated, in some examples. The plant evolution and state prediction may be as illustrated at 194. With each step, Δt, the tracking of plant evolution and states prediction moves forward to represent the system dynamics; re-executing the NMPC calculation addresses changes in the input disturbances.

FIG. 5 helps with the understanding of a simplified assessment, focusing just on the chiller and battery aspects of the system. Here, T indicates temperature:

- $T_b$ is internal temperature of the battery pack.
- $T_1$ is temperature of the coolant entering the battery.
- $T_2$ is temperature of the coolant leaving the battery pack.
- $T_3$ is temperature of the coolant entering the pump/leaving the chiller.
- $T_5$ is temperature of the refrigerant leaving the chiller at the coolant side.
- $T_6$ is temperature of the refrigerant entering the chiller at the coolant side.
- $I_b$ is the current through the battery pack due to charging or usage/driving.
- $m_1$ is the mass flow of the coolant entering the battery.
- $m_5$ is the mass flow of the refrigerant leaving the chiller at the coolant side.
- $m_6$ is the mass flow of the refrigerant entering the chiller at the coolant side.

The relationships among the variables are then determined from the dynamic mathematical model of each element of the loop, as follows.

The battery pack thermal model describes the distribution of temperature in the battery pack. Using a lumped aggregate temperature model for the battery pack (thereby reducing computational burden for purposes of illustration; more complex models of the battery pack in an EV, having hundreds or thousands of cells, may be used as desired), the dynamic equation for change in battery temperature, $T_b$, is:

$$\frac{dT_b}{dt} = \frac{1}{m_b C_b}\left(p_{el,h} R_b(SOC, T_b) \cdot I_b^2 - (hA)(T_b - T_1)\right) \tag{2}$$

Where:

- $T_b$ is the lumped temperature of the battery pack.
- $m_b$ is the lumped battery pack mass.
- $C_b$ is the heat capacity of the battery pack.
- $I_b$ is the current through the battery pack.
- $R_b$ is the equivalent internal resistance of the battery pack, which considers a pure resistive equivalent circuit for the battery, and varies in Equation 2 based on battery temperature and SOC.
- $P_{el,h}$ is a parameter quantifying how much heat is generated due to electric power.
- h is the heat transfer coefficient of the pack to the cooling system.
- A is the equivalent convective surface area.
- hA is the overall heat transfer coefficient between the battery and the coolant.

Equation 2 estimates (determines) a rate of battery temperature change by determining heat generated in the battery, including internal heat generated by current flow, less heat lost to the circulating coolant, all divided by the mass and heat capacity of the battery pack. Coolant outlet temperature is dynamic as well and is governed by this Equation 3:

$$\frac{dT_2}{dt} = -\frac{\dot{m}_2 C_{pc}}{m_c C_{pc}}(T_2 - T_1) + \frac{hA}{m_c C_{pc}}(T_b - T_1) \tag{3}$$

Where, here, the same heat transfer coefficient is applied (hA), along with heat capacity of the coolant, $C_{pc}$, and mass of coolant within the portion of the coolant tubes that are in the battery pack, $m_c$.

The battery SOC is not static, and changes as well, according to Equation 4:

$$\frac{dSOC}{dt} = \frac{V_{oc}(SOC, T_b)}{3600 \cdot E^M} I_b - \frac{R_b(SOC, T_b)}{3600 \cdot E^M} \cdot I_b^2 \tag{4}$$

Where $V_{oc}(SOC, T_b)$ is the open circuit voltage of the battery given a particular temperature and battery SOC, and $E^M$ represents the battery nominal capacity in Amp-Hours (or other unit, as desired; the coefficient 3600 is shown in Equation 4 assuming conversion between Amp-Hours and seconds and may be modified for other unit conversions). If desired, other functions or equivalent circuits may be used; the above assumes a purely resistive battery impedance, and correction can be made to account more fully for complex impedance. As noted, the evolution of battery temperature here is represented using a lumped battery pack model; and, again, more complex models can be used as desired. Finally, outlet coolant temperature is modeled in a fairly simple manner; more sophisticated models may be used.

The coolant pump actions affect the system in several ways, including modifying the energy content of coolant as it passes. The pump may be modeled including contemplation of pressure as shown in Equation 5:

$$P_p = \dot{m}_1(h_3 - h_1) \tag{5}$$

Where:

- $P_p$ is the power consumption of the pump.
- $m_1$ is the mass flow of the coolant exiting the pump (same as the battery).
- $h_3$ is the coolant enthalpy entering the pump.
- $h_1$ is the coolant enthalpy exiting the pump.

One may simplify this by omitting pressure variations and approximating as in Equation 6:

$$(h_3 - h_1) \approx C_{pc}(T_3 - T_1) \tag{6}$$

Therefore, using the approximation of Equation 6:

$$P_p \approx \dot{m}_1 C_{pc}(T_3 - T_1) \tag{7}$$

The action of the pump can also be used to determine the relationship between flow mass and power, which can be approximated as:

$$P_p = \eta_p k_p (\dot{m}_1)^2 \tag{8}$$

Where:

$\eta_p$ is the pump efficiency; and $k_p$ is a constant factor.

Taking equations 7 and 8 together, the relationship between inlet and outlet temperatures relative to the pump, and the pump mass flow, can be established directly:

$$T_1 = T_3 - \frac{\eta_p k_p}{C_{pc}} \dot{m}_1 \tag{9}$$

Next, the chiller model is considered. The chiller is a heat exchanger, governed by the following equation:

$$\frac{dT_3}{dt} = \frac{C_{pc}\dot{m}_1}{C_{pc}m_{cc}}(T_2 - T_3) - \frac{1}{C_{pc}m_{cc}} Q_{rem} \tag{10}$$

In Equation 10, $m_{cc}$ is the mass of battery coolant inside the chiller, and $Q_{rem}$ is the heat removed by the chiller. For purposes of Equation 10, only the energy balance over the chiller is considered. Power consumption of the chiller can then be related to the heat removed and compressor efficiency for the refrigerant loop:

$$Q_{rem} = h(\eta_c, P_c) = \eta_c \cdot P_c \tag{11}$$

Where h depends on the compressor efficiency, $\eta_c$, and may in a simplistic approach be treated as equal to the product of compressor power consumption and efficiency, as shown. Simplifying equation 10 to remove the coolant heat capacity, and substituting equation 11, the dynamics equation for $T_3$ becomes:

$$\frac{dT_3}{dt} = \frac{\dot{m}_1}{m_{cc}}(T_2 - T_3) - \frac{1}{C_{pc}m_{cc}} \eta_c \cdot P_c \tag{12}$$

Using the preceding models, a BTMS circuit can be represented in mathematical form as:

$$\begin{bmatrix} \dot{T}_b \\ \dot{T}_2 \\ \dot{T}_3 \\ S\dot{O}C \end{bmatrix} = f_c(T_b, T_2, T_3, SOC, \dot{m}_1, Q_{rem}, I_b) \tag{13}$$

Which may be more compactly represented as:

$$\dot{x} = f_c(x, u, w) \tag{14}$$

Where the state variables (x) are set as the temperatures and the battery state of charge, the inputs (u) that can be manipulated are the mass flow and heat removed, and the disturbance (w) is the battery current, which corresponds to the battery output current during driving, and to the input current during charging. The use of battery current as the disturbance, rather than as the variable to be controlled, is distinct from other methodologies in the art that address potential battery degradation by controlling battery current during charging.

Assembling the above models together, and making appropriate substitutions, the state transition function can be completely expressed as follows:

$$f_c(T_b, T_2, T_3, m_1, Q_{rem}, I_b) = \tag{15}$$

$$\begin{bmatrix} -\frac{h \cdot A}{m_b C_b} T_b + \frac{h \cdot A}{m_b C_b} T_3 - \frac{h \cdot A \cdot \eta_p k_p}{C_{pc} m_b C_b} \dot{m}_1 + \frac{p_{el,h} R_b}{m_b C_b} I_b^2 \\ \frac{hA}{m_c C_{pc}} T_b - \frac{\dot{m}_2}{m_c} T_2 + \left( \frac{\dot{m}_2 C_{pc} - hA}{m_c C_{pc}} \right) T_3 + \left( \frac{h \cdot A \cdot \eta_p k_p - \dot{m}_2 C_{pc} \cdot \eta_p k_p}{m_c C_{pc}^2} \right) \dot{m}_1 \\ \frac{\dot{m}_1}{m_{cc}} T_2 - \frac{\dot{m}_1}{m_{cc}} T_3 - \frac{1}{C_{pc} m_{cc}} \eta_c \cdot P_c \\ \frac{V_{oc}(SOC, T_b)}{3600 \cdot E^M} I_b - \frac{R_b(SOC, T_b)}{3600 \cdot E^M} \cdot I_b^2 \end{bmatrix}$$

To derive a discrete time function from the continuous function shown in (15), a discretization is performed, using a discretization step that is preferably 5 to 25 times shorter than the fastest settling time of the states. The discretization step may be, for example, in the range of less than one second, such as in the range of about 1 millisecond to about 1000 milliseconds.

An objective cost function may take a form as shown in Equation 16:

$$\sum_{\tau=t}^{t+N} l(x(\tau), u(\tau), w(\tau), W(\tau)) = \sum_{\tau=t}^{t+N} \left( W_{EC,1}\eta_p k_p(\dot{m}_1(\tau))^2 + W_{EC,2}\frac{Q_{rem}(\tau)}{\eta_c} + d(T_b(\tau), SOC(\tau), I_b(\tau), W_{HC}) \right) \tag{16}$$

Where the first two terms of the objective function represent the energy cost and correspond to the energy consumption of the coolant pump and the refrigerant flow through the chiller, respectively, calculating using Equations 8 and 11, above. The function d(•) in the last term corresponds to the health cost quantifying the battery degradation caused by the temperature, SOC and current. It should be noted that this objective function is economic, which implies that the BTMS will look for the lowest energy consumption strategy possible that also minimizes the battery degradation.

Equation 17 provides an illustrative example of the d(•) function:

$$d(T_b(\tau), SOC(\tau), I_b(\tau), \{W_{HC,\{1,2,3\}}\}) = W_{HC,1}d_{cal}(T_b(\tau), SOC(\tau)) + W_{HC,2}d_{cyc}(T_b(\tau), SOC(\tau), I_d(\tau)) + W_{HC,3}d_{ch}(T_b(\tau), SOC(\tau), I_c(\tau)) \tag{17}$$

Here, $w_{HC,1}$, $w_{HC,2}$, and $w_{HC,3}$ are the degradation costs of the battery corresponding to individual aging mechanisms of calendar aging ($d_{cal}$), cyclic aging ($d_{cyc}$, mainly due to SEI growth), and charging ($d_{ch}$), respectively. Each of those costs may be constant in time, or may vary based on a schedule or external variables. For example, $d_{cal}$ is independent of current, and may apply for portions of the time horizon in which battery current is predicted to be zero, near zero, or below a nominal threshold that may be specific to a given vehicle and/or empirically determined for a particular battery design; in some illustrations dcal may apply to portions of the prediction horizon in which the battery is not being charged and the battery is not being used to provide motive power. The variable, $d_{cal}$, may be the main driver of the cost function during stand-by and is related mainly to the temperature and SOC conditions of the battery. The cyclic aging term, $d_{cyc}$, can be seen to rely on the normal conditions of charging/discharging of the battery, under which the current profiles are within the limits specified by the manufacturer for the standard operation. Finally, the charging term, $d_{ch}$, is dominant during charging, particularly high current charging, and is mainly operable while no driving takes place and high current charging is occurring. The cyclic aging term and charging term may both apply when the battery current is above a nominal threshold. Thus at any given time in the prediction horizon, one of these models applies. In some examples, fewer models may be used, such as a single model for any current output and a single model for any current input, if desired.

The first aging term, $d_{cal}$ can be expressed with derivation from the Arrhenius equation, shown in Equation 18:

$$d_{cal}(T_b(\tau), SOC(\tau)) = A(SOC(\tau)) \cdot \exp\left(\frac{E_{a,cal}}{R \cdot T(\tau)}\right) \tag{18}$$

The A function would be calibrated by testing on actual battery cells, as would the parameters $E_{\alpha,cal}$ and α, calibrated using low current or no current aging tests, for example.

The second aging term, $d_{cyc}$, can also be expressed with derivation from the Arrhenius equation, as shown in Equation 19:

$$d_{cyc}(T_b(\tau), SOC(\tau), I_b(\tau)) = B(I_b(\tau)) \cdot \exp\left(-\frac{E_a, cyc + \alpha|I_b(\tau)|}{R \cdot T(\tau)}\right) \tag{19}$$

The B function is calibrated by testing on actual battery cells, as would the parameters $E_{\alpha,cyc}$ and α, this time under current draw.

Alternatively to the aforementioned empirical models, more sophisticated degradation models may be used, such as pseudo-two-dimensional model or single particle model electrochemical models. Such degradation models may consider irreversible degradation and capacity fade, but may also consider chemical phenomena that limit charging power/current. On the other hand, more simplistic but physics-based models, such as impedance-based models that reflect lithium plating phenomenon, may be used for determining the degradation caused during charging, and to establish secure operation limits, given in the form of a maximum charging current for a particular temperature and battery SOC, and/or in the form of a function to evaluate the effects on longevity, capacity, impedance or other operational characteristic of any given charging current at a particular temperature and battery SOC. The term, $d_{ch}$, can thus be derived using, for example, any such model calibrated using actual battery cells in a test environment.

As noted, the battery current $I_b$, which may be treated in the above equations as equal to $I_d$ when the battery discharges during driving, and $I_c$ when the battery is being charged, is taken as a disturbance for the controller design. Battery current may be measured and/or estimated during driving periods. A simple approach predicts battery current through the prediction horizon as being constant and equal to a most recently measured battery current. More sophisticated approaches to the battery current prediction may be used, if desired. For example, neural networks or polynomial models based on estimation of speed and/or acceleration profiles for a route ahead of the vehicle may be used to predict future power demands and thus estimate current during the prediction horizon.

For example, if available, navigation data may be used to project a travel route, from which a vehicle velocity preview may be calculated using prevailing conditions and/or route data (speed limits, traffic, etc.); likely battery current over such a prediction horizon may be calculated using the vehicle velocity preview and route-related data (turns, grade, etc.). Battery charging current can be obtained from charging station using, for example, communication with a charging station to obtain measured currents and/or current profile. A charging current preview for use in optimization may consider multiple-step charging, for example, using constant current (DC) battery charging (with one or more preset current levels) during a first time period of charging, and constant voltage battery charging as the battery nears its capacity. A charging current preview may also identify, such as from driver input, by communication with a charging station and/or using navigation data to determine proximity, the type of charging station that will be used.

Thermal preconditioning may also be performed. Doing so may occur in response to proximity to a charging station while the battery is in a discharged state, with an SOC below a threshold, for example, in the range of 50% or less of total SOC. Navigation system data or even a driver input, or battery SOC, may each separately or together be used to identify a likely upcoming charging event. Thermal preconditioning can be understood as a preparation for use of a charging station, including for high current charging.

For each preview information described above, the prediction and vehicle position data used in such predictions should be updated in a time frame that is shorter than the length of the prediction horizon used in Equations 1 and 16, so that the controller can adequately integrate such information and predictions.

The configuration shown in FIG. 6 suggests a control structure with a single level. Hierarchical control may be used instead, as shown in the illustrative controller configuration of FIG. 7. A non-linear optimizer 200 receives a forecast of disturbances, $w_{t:t+N}$, and provides reference optimal control actions $u_{ref\_t:t+N}$, and reference state trajectory $x_{ref\_t:t+N}$, to the reference tracking controller 202. A set of control signals, $\tilde{u}^*(t)$ are calculated by the reference tracking controller and communicated to the plant 204.

Referring briefly to FIG. 4, the control signals may, for example, command operations of one or more of the heat exchanger/chiller 106, heater 110, valves 104, 108, and pump 100, to control the temperature of the battery 102 by increasing or decreasing circulating fluid mass flow and temperature. If the chiller 106 is coupled to, for example, a vapor cycle cooling system, activity in the vapor cycle cooling system may be controlled, by indicating the reference temperature at the output of the chiller (such as by sending a target temperature to the chiller controller), or acting over the magnitude of the input power to the chiller 106, to increase or decrease the heat drawn from the circulating fluid at the chiller 106. On the other hand, the control actions for valves may be (if desired) on-off signals, and for the pump, the actions may be, for example, the input power, current or speed of the pump, Not all of these factors need to be controlled, at least directly; for example, a temperature setpoint in the chiller 106 may be issued, and operations of the cabin cooling system can be handled separately by a cabin cooling system controller to achieve the cabin temperature setpoint. In an example, the control signals include a temperature setpoint for a vapor cycle cooling system and a pump control signal to control pump 100 speed, generated either by the reference tracking controller 202, or by the NMPC 190. The heater 110 and/or one or both of the valves 104, 108 can be omitted, if desired, though it is likely that most implementations will provide both battery cooling and heating to aid use of a vehicle in both cold and warm weather climates.

Feedback from the plant occurs with each sample period Δt, as indicated with measurements z(t+Δt) provided from the plant 204 to the reference tracking controller 202. Measurements z(t+N) are also fed back to the non-linear optimization, which recalculates the references from time to time. Measurements may be provided to the non-linear optimizer more frequently than after time t+N, for example, after t+1, t+3, etc., as desired.

Figure 7:
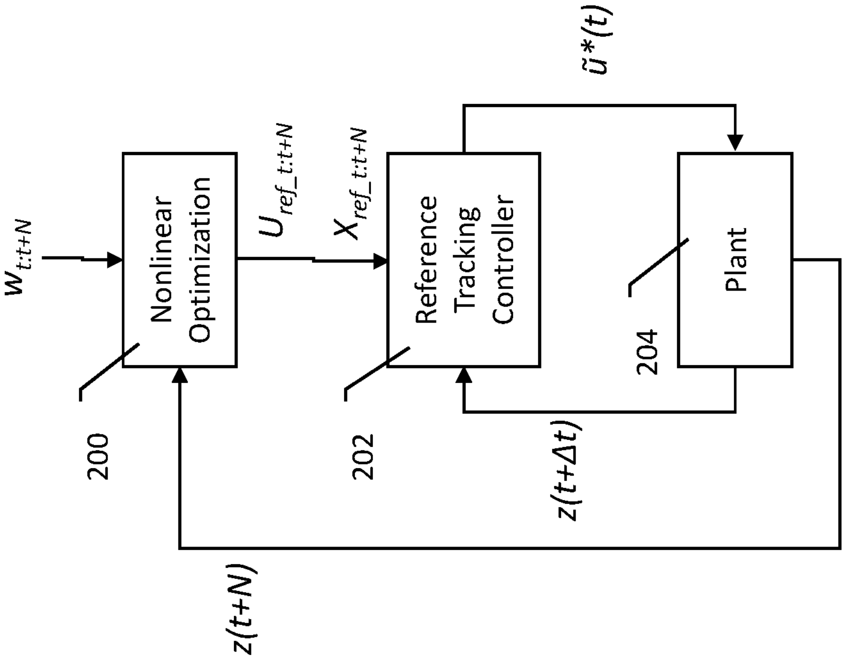

With the structure in FIG. 7, the problem in Equation 1 can be divided into two problems. The first part of the problem is as shown in Equation 20:

$$\min_{u_{ref}} \sum_{\tau=t}^{t+N} l(x_{ref}(\tau), u_{ref}(\tau), w(\tau)W(\tau)) \tag{20}$$

-continued

Subject to:

$$x_{ref}(\tau+\Delta\tau) = f(x_{ref}(\tau), u_{ref}(\tau), w(\tau)), \quad \forall \tau \in \{t, t+\Delta t, \ldots, t+N-\Delta t, t+N\}$$

$$x_{ref}(t) = z(t)$$

$$x_{min} \le x_{ref}(\tau) \le x_{max}, \quad \forall \tau \in \{t, t+\Delta t, \ldots, t+N-\Delta t, t+N\}$$

$$u_{min} \le u_{ref}(\tau) \le u_{max}, \quad \forall \tau \in \{t, t+\Delta t, \ldots, t+N-\Delta t, t+N\}$$

The optimization is similar to that of Equation 1, above, except as follows. Optimization may be performed, for example, in an advance control framework as described in US PG Pub. 2022/0343702, the disclosure of which is incorporated herein by reference, or may be performed remotely such as in a cloud-based server. The battery state of health may be included as an additional stage, such that model f(•) would be extended beyond that shown in the first example above, to include a new sub-function expressing the dynamics of battery state of health. An example of this extension may include an aging transfer function ($G_{aging}$) and a static input nonlinearity ($C_{aging}$), as shown in Equation 21:

$$SoH = G_{aging}(s)\cdot C_{aging}(SoC, T_b, I_b) \tag{21}$$

$$G_{aging}(s) = \frac{B_{aging}(s)}{A_{aging}(s)}$$

$$C_{aging}(SoC, T_b, I_b) = \left(a_4 I_b^2 + a_3 I_b + a_2 SoC^2 + a_1 SoC + a_0\right)\cdot \exp\left(\frac{E_a}{R_t}\left[\frac{1}{T_{ref}} - \frac{1}{T_b}\right]\right)$$

Here, s is the Laplace operator used in the theory of linear systems, and $A_{aging}(s)$ and $B_{aging}(s)$ are the numerator and denominator of the linear part of the model which can be estimated using data capturing state of health degradation measured at various SOC, temperature and electric current conditions. In addition, $a_0$, $a_1$, $a_2$, $a_3$, and $a_4$ are parameters of the combined $I_b$ and SOC contribution to the battery aging process, $E_a$ is an activation energy parameter, $R_t$ is the gas constant (8.314 $J\cdot mol^{-1}\cdot K^{-1}$), and $T_{ref}$ is a reference temperature. Other models may be used, whether more or less complex and/or including additional influences such as ambient temperature.

Next, based on the historical record of state of health evolution, SOH([0,t]), and the state of health over the current prediction horizon, SOH([t,t+N]), the predicted end of life for the battery, $T_{EOL}$, may be calculated as shown in Equation 22:

$$T_{EoL} = T_{EoL}(SOH([0,t]), SOH([t,t+N]), SOH_{thd}) \tag{22}$$

Here, $SOH_{thd}$ is a threshold value for state of health that would need to be specified for the given battery and system design. For example, if the state of health (SOH) of a completely healthy battery is set at 1, and SOH for a destroyed battery is set to 0, $SOH_{thd}$ can be set at 0 or any desired value in the interval [0,1] where, for example, the actual value may be set as desired and in accordance with other system requirements (such as driving performance or charging requirements, for example). Calculation of $T_{EOL}$ may use interpolation of past and currently predicted values and extrapolation over a longer future time horizon. The optimization criterion can then be adjusted as shown in Equation 23:

$$\min_{u_{ref}}\left(W_{HC}\cdot\frac{1}{T_{EoL}}+\sum_{\tau=t}^{t+N}l(x_{ref}(\tau),\,u_{ref}(\tau),\,w(\tau),\,W(\tau))\right) \tag{23}$$

Where l(•) is shown containing only the economic terms, while $W_{HC}\cdot 1/T_{EOL}$ incorporates maximization of the end of life with a weight, $W_{HC}$. Other formulations to incorporate battery lifetime maximization may be used, for example as shown in Equation 24:

$$\min_{u_{ref}}\left(W_{HC}\cdot\max(T_{EoL,std}-T_{EoL},\,0)+\sum_{\tau=t}^{t+N}l(x_{ref}(\tau),\,u_{ref}(\tau),\,w(\tau),\,W(\tau))\right) \tag{24}$$

Where $T_{EOL,std}$ may represent an expected or standard end of life time period (such as a period of years), and so the term max ($T_{EOL,std}-T_{EOL}$, 0) quantifies the difference between the predicted battery life and the standard battery life. In this example, if the predicted lifetime, $T_{EOL}$ is longer than the standard lifetime, no penalty applies.

Another alternative may use Equation 25:

$$\min_{u_{ref}}\left(W_{HC}\cdot(SOH(t)-SOH(t+N))+\sum_{\tau=t}^{t+N}l(x_{ref}(\tau),\,u_{ref}(\tau),\,w(\tau),\,W(\tau))\right) \tag{25}$$

This version uses the decrease in the battery state of health over the prediction horizon (time t to time t+N), which is multiplied by the weight factor, $W_{HC}$. If using monetary measures, then the weight, WHC in Equation 25 may be the cost of battery replacement. For such an approach, the monetary cost of electricity consumed at a charging station may be used internal to l(•) Other factors and weight variables may be used as desired.

Using any of the preceding for the high-level optimization, the nonlinear optimization controller 200 can observe the impact of manipulated variables on both economic and health-related aspects of the BTMS. Profiles of $x_{ref}$ and $u_{ref}$ can be calculated to balance these impacts.

The implementation of FIG. 7 is different from that of FIG. 6 in that the receding horizon control strategy may or may not be applied to calculate $x_{ref}$ and $u_{ref}$, as desired. It may be further noted that the measurements, z, provided to the high-level non-linear optimizer may be updated in a timeframe that is shorter than the prediction horizon. The solution of the non-linear optimization is sent to the reference tracking controller 202 in FIG. 7, whose control strategy may be as shown here in Equation 26:

$$\min_{\tilde{u}}\sum_{\tau=t}^{t+\tilde{N}}\|\tilde{x}(\tau)-x_{ref}(\tau)\|_Q^2+\|\tilde{u}(\tau)-u_{ref}(\tau)\|_R^2 \tag{26}$$

Subject to:

$$\tilde{x}(\tau+\Delta\tau)=A\tilde{x}(\tau)+B\tilde{u}(\tau),\quad\forall\,\tau\in\{t,\,t+\Delta t,\,\ldots,\,t+\tilde{N}-\Delta t,\,t+\tilde{N}\}$$

$$x(t)=z(t)$$

-continued $$x_{min}\le\tilde{x}(\tau)\le x_{max},\quad\forall\,\tau\in\{t,\,t+\Delta t,\,\ldots,\,t+\tilde{N}-\Delta t,\,t+\tilde{N}\}$$

$$u_{min}\le\tilde{u}(\tau)\le u_{max},\quad\forall\,\tau\in\{t,\,t+\Delta t,\,\ldots,\,t+\tilde{N}-\Delta t,\,t+\tilde{N}\}$$

Each symbol in Equation 26 may be as described previously. The evolution of the states $\tilde{x}$ may be governed by a linearized version of the function f(•) discussed previously relative to Equation 20, above, as indicated by the use of the linear matrices A and B. The linearization is proposed in order to reduce computational burden of the optimization problem that would be executed on-board the vehicle by the reference tracking controller 202. The low-level controller may use a different (shorter) sampling period, Δt, than the high-level non-linear optimizer in some examples. Other more or less complex models may be used such as to provide greater details, or faster dynamics. The minimized function in Equation 26 indicates that the 2-norm of $\tilde{x}(\tau)-x_{ref}(\tau)$ and $\tilde{u}(\tau)-u_{ref}(\tau)$ are weighted by weights Q and R, respectively. The formulation of Equation 26 uses a model predictive control framework. Any other control strategy for reference tracking, such as a linear quadratic regulator, may instead be used. The references may be used by the low level controller to issue control signals similar to those noted previously with respect to the implementation of FIG. 6.

The computational complexity required of the reference tracking controller 202 is also reduced relative to that required by Equation 1 due to the fact that the reference signals for the states and inputs can be computed by the high-level controller 200, which, as noted, may be located off-vehicle such as in the cloud, or may be executed on board using a separate, dedicated controller. The references for the trajectory of states and inputs should be updated at least in a time frame equal to the new prediction horizon, that is, such that $\tilde{N}\le N$. Another adjustment that may be incorporated is that the upper level optimization may be performed with a longer sampling time than that used by the low-level controller, if desired. Still another adjustment may allow the constraints ($x_{min}$, $x_{max}$, $u_{min}$, $u_{max}$) to be different in each of the high-level and low-level controllers, as desired.

The preceding focuses primarily on the use of the chiller to cool the circulating fluid, and the dynamics and balancing associated with cooling. For most vehicles, the heater will be inactive most of the time, as the primary mode of operation during driving and charging cycles will require cooling the battery. However, as noted, a heater is also included, and the optimization routine can be further specified to rigorously handle heater behavior in like fashion.

With reference to FIG. 4, Equation 10 can be updated to the following:

$$\frac{dT_3}{dt}=\frac{C_{pc}\dot{m}_1}{C_{pc}m_{cc}}(T_2-T_3)-\frac{1-o_v}{C_{pc}m_{cc}}Q_{rem}+\frac{o_v}{C_{pc}m_{cc}}Q_{add} \tag{27}$$

Where $o_v$ is a new, binary variable indicating synchronized operation of the valves V1 108 and V2 104. When if $o_v=1$, the valves route all circulating fluid flow through the heater 110, and if $o_v=0$, all circulating fluid flow is through the chiller 106. The other new variable, Qadd is the heat added to the circulating fluid by the heater. Assuming an electric heater, the heater power consumption can be modeled as:

$$V_h*I_h=P_h=\frac{Q_{add}}{\eta_h} \tag{28}$$

Where $V_h$ and $I_h$ are the voltage and current delivered to the heater, and $\eta_h$ is the heater efficiency. More sophisticated models can be used, as the skilled artisan would recognize.

Such updates would ripple through the above set of formulas, leading to an update on the cost function in Equation 16 as follows:

$$\sum_{\tau=t}^{t+N} l(x(\tau), u(\tau), w(\tau), W(\tau)) = \sum_{\tau=t}^{t+N} \left( W_{EC,1}\eta_p k_p(\dot{m}_1(\tau))^2 + W_{EC,2}\frac{Q_{rem}(\tau)}{\eta_c} + W_{EC,3}\frac{Q_{add}(\tau)}{\eta_h} + d(T_b(\tau), SOC(\tau), I_b(\tau), W_{HC}) \right) \tag{29}$$

Where $W_{EC,3}$ is the weighting term used for operation of the heater.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A vehicle comprising:

a powertrain including an electric motor and a rechargeable battery coupled to the electric motor to provide drive power for the vehicle, the rechargeable battery including a first temperature sensor configured to sense a temperature of the rechargeable battery;

a thermal management system for the rechargeable battery using a circulating fluid to control temperature of the rechargeable battery, the thermal management system including a chiller for cooling the circulating fluid; and a battery thermal management system (BTMS) controller configured to control operation of the thermal management system by:

obtaining a set of temperatures from the thermal management system, including at least one temperature of the circulating fluid, and a battery temperature;

estimating a state of charge (SOC) of the battery;

using a battery thermal model to estimate heat transfer between the circulating fluid and the battery, and a chiller model to estimate heat transfer in the chiller;

predicting, over a time horizon having a duration of the time horizon, a future battery current profile as a disturbance input to the battery thermal model based at least in part on a predicted future power demand derived from at least one of a speed profile and an acceleration profile for a route ahead of the vehicle;

classifying, within the time horizon, portions in which the future battery current profile is predicted (i) to be below a nominal threshold, (ii) to be issued from the battery to the powertrain, and (iii) to be injected to the battery at a level that exceeds the nominal threshold;

applying a cost function minimization to determine control parameters to issue to the thermal management system by minimizing a sum of economic costs of battery health effects in the time horizon, the sum of economic costs varying with SOC of the battery, and economic costs of operation of the thermal management system in the time horizon, including:

using a first battery deterioration model due to aging for first portions of the time horizon classified as having the future battery current profile predicted to be below the nominal threshold, using a second battery deterioration model during battery discharge for second portions of the time horizon classified as having the future battery current profile predicted to be issued from the battery to the powertrain, and using a third battery deterioration model during battery charging for third portions of the time horizon classified as having the future battery current profile predicted to be injected to the battery at the level that exceeds the nominal threshold; and issuing the control parameters to the thermal management system.

2. The vehicle of claim 1, wherein the BTMS controller is configured to perform the cost function minimization by selecting weighting factors for at least two models of battery deterioration used for the first, second, and third portions of the time horizon classified in claim 1, the weighting factors being based on the battery current profile in the time horizon.

3. The vehicle of claim 1, wherein the BTMS controller is configured to perform the cost function minimization by using the first battery deterioration model for battery deterioration due to aging, in which an aging rate depends on at least one of an average temperature of the battery and the SOC in the first portions of the time horizon classified as having the battery current profile predicted to be below the nominal threshold.

4. The vehicle of claim 1, wherein the BTMS controller is configured to perform the cost function minimization by using the second battery deterioration model for battery deterioration during battery discharge due to powertrain operation, the second battery deterioration model computing a discharge-related deterioration contribution over the second portions of the time horizon classified as having the battery current profile predicted to be issued from the battery to the powertrain.

5. The vehicle of claim 1, wherein the BTMS controller is configured to perform the cost function minimization by using the third battery deterioration model for battery deterioration during battery charging, the third battery deterioration model computing a charging-related deterioration contribution over the third portions of the time horizon classified as having the battery current profile predicted to be injected to the battery at a level that exceeds the nominal threshold.

6. The vehicle of claim 1, wherein the BTMS controller is configured to perform the cost function minimization using a non-linear model predictive control (NMPC) analysis, a prediction horizon of the NMPC analysis defining the time horizon over which the future battery current profile is predicted.

7. The vehicle of claim 6, wherein the BTMS controller is configured to use the NMPC analysis to calculate a plurality of sets of control signals through the prediction horizon, issue a first of the sets of control signals, obtain a new set of temperatures, and repeat the cost function minimization.

8. The vehicle of claim 1, wherein the thermal management system includes the chiller coupled to a vapor cycle cooling system, and a pump, wherein the set of control signals includes at least a control signal for operation of the pump, and a setpoint for the vapor cycle cooling system.

9. The vehicle of claim 1, wherein the thermal management system includes a heater and first and second valves for directing flow of the circulating fluid through either the heater or the chiller, and the economic costs in the cost function minimization include a term for the heater and a term for the chiller.

10. A vehicle comprising:

a powertrain including an electric motor and a rechargeable battery coupled to the electric motor to provide drive power for the vehicle, the rechargeable battery including a first temperature sensor configured to sense a temperature of the rechargeable battery;

a thermal management system for the rechargeable battery using a circulating fluid to control temperature of the rechargeable battery, the thermal management system including a chiller for cooling the circulating fluid; and a reference tracking controller coupled to the thermal management system and configured to use a set of references to control operation of the thermal management system;

a non-linear optimizing controller configured to calculate and communicate the set of references to the reference tracking controller by:

obtaining a set of temperatures from the thermal management system, including at least one temperature of the circulating fluid, and a battery temperature;

estimating a state of charge (SOC) of the battery;

using a battery thermal model to estimate heat transfer between the circulating fluid and the battery, and a chiller model to estimate heat transfer in the chiller;

predicting, over a time horizon having a duration of the time horizon, a future battery current profile as a disturbance input to the battery thermal model;

classifying, within the time horizon, portions in which the future battery current profile is predicted (i) to be below a nominal threshold, (ii) to be issued from the battery to the powertrain, and (iii) to be injected to the battery at a level that exceeds the nominal threshold;

applying a cost function minimization to determine the set of references for controlling the thermal management system by minimizing a sum of economic costs of battery health effects in the time horizon, the sum of economic costs varying with SOC of the battery, and economic costs of operation of the thermal management system in the time horizon, including:

using a first battery deterioration model due to aging for first portions of the time horizon classified as having the future battery current profile predicted to be below the nominal threshold, using a second battery deterioration model during battery discharge for second portions of the time horizon classified as having the future battery current profile predicted to be issued from the battery to the powertrain, and using a third battery deterioration model during battery charging for third portions of the time horizon classified as having the future battery current profile predicted to be injected to the battery at the level that exceeds the nominal threshold; and issuing the set of references to the reference tracking controller.

11. The vehicle of claim 10, wherein the non-linear optimizing controller is configured to periodically calculate and communicate the set of references calculated for a first sampling time period to the reference tracking controller at a first period, the reference tracking controller configured to apply the set of references to control the thermal management system using a second sampling time period, the second sampling time period being shorter than the first sampling time period.

12. The vehicle of claim 10, wherein the non-linear optimizing controller is configured to perform the cost function minimization by assigning respective weighting factors to at least two models of battery deterioration used for the first, second, and third portions of the time horizon based on the battery current profile in the time horizon.

13. The vehicle of claim 10, wherein the non-linear optimizing controller is configured to perform the cost function minimization by using the first battery deterioration model for battery deterioration due to aging, the first battery deterioration model computing an aging-related deterioration contribution as a function of at least one of an average temperature of the battery and the SOC in portions of the time horizon in which the future battery current profile is predicted to be below the nominal threshold.

14. The vehicle of claim 10, wherein the non-linear optimizing controller is configured to perform the cost function minimization by using the second battery deterioration model for battery deterioration during battery discharge due to powertrain operation, the second battery deterioration model computing a discharge-related deterioration contribution over the second portions of the time horizon in which the future battery current profile is predicted to be issued from the battery to the powertrain.

15. The vehicle of claim 10, wherein the non-linear optimizing controller is configured to perform the cost function minimization by using the third battery deterioration model for battery deterioration during battery charging, the third battery deterioration model computing a charging-related deterioration contribution over the third portions of the time horizon in which the future battery current profile is predicted to be injected to the battery at a level that exceeds the nominal threshold.

16. The vehicle of claim 10, wherein the thermal management system includes a heater and first and second valves for directing flow of the circulating fluid through either the heater or the chiller, and the economic costs in the cost function minimization include a term for the heater and a term for the chiller.

17. A method of controlling battery temperature in a vehicle, the vehicle including a powertrain including an electric motor and a battery coupled to the electric motor to provide drive power for the vehicle, the rechargeable battery including a first temperature sensor configured to sense a temperature of the battery, and a thermal management system for the battery using a circulating fluid to control temperature of the battery, the thermal management system including a chiller for cooling the circulating fluid; the method comprising:

issuing control signals from a reference tracking controller to control operation of the thermal management system using a set of references;

issuing the set of references to the reference tracking controller from a non-linear optimizing controller;

calculating the set of references at the reference tracking controller by:

obtaining a set of temperatures from the thermal management system, including at least one temperature of the circulating fluid, and a battery temperature;

estimating a state of charge (SOC) of the battery;

using a battery thermal model to estimate heat transfer between the circulating fluid and the battery, and a chiller model to estimate heat transfer in the chiller;

predicting, over a time horizon having a duration of the time horizon, a battery current profile as a disturbance input to the battery thermal model; and classifying, within the time horizon, portions in which the battery current profile is predicted (i) to be below a nominal threshold, (ii) to be issued from the battery to the powertrain, and (iii) to be injected to the battery at a level that exceeds the nominal threshold; and applying a cost function minimization to determine the set of references for controlling the thermal management system by minimizing a sum of economic costs of battery health effects in the time horizon, the sum of economic costs varying with SOC of the battery, and economic costs of operation of the thermal management system in the time horizon, including:

using a first battery deterioration model due to aging for first portions of the time horizon classified as having the battery current profile predicted to be below the nominal threshold, using a second battery deterioration model during battery discharge for second portions of the time horizon classified as having the battery current profile predicted to be issued from the battery to the powertrain, and using a third battery deterioration model during battery charging for third portions of the time horizon classified as having the battery current profile predicted to be injected to the battery at the level that exceeds the nominal threshold.

18. The method of claim 17, wherein the step of calculating the set of references is performed by using the first battery deterioration model for battery deterioration due to aging, the first battery deterioration model computing an aging-related deterioration contribution as a function of at least one of an average temperature of the battery and the SOC in the first portions of the time horizon in which the battery current is predicted to be below the nominal threshold.

19. The method of claim 17, wherein the step of calculating the set of references is performed by using the second battery deterioration model for battery deterioration during battery discharge due to powertrain operation, the second battery deterioration model computing a discharge-related deterioration contribution over the second portions of the time horizon in which the battery current profile is predicted to be issued from the battery to the powertrain.

20. The method of claim 17, wherein the step of calculating the set of references is performed by using the third battery deterioration model for battery deterioration during battery charging, the third battery deterioration model computing a charging-related deterioration contribution over the third portions of the time horizon in which the predicted future battery current is predicted to be injected to the battery at a level that exceeds the nominal threshold.

* * * * *